US006805770B1

(12) United States Patent
Oster

(10) Patent No.: US 6,805,770 B1
(45) Date of Patent: Oct. 19, 2004

(54) TECHNIQUE FOR IMPROVING UNIFORMITY OF MAGNETIC FIELDS THAT ROTATE OR OSCILLATE ABOUT AN AXIS

(75) Inventor: Eugene L. Oster, Los Gatos, CA (US)

(73) Assignee: Oster Magnetics, Inc., San Jose, CA (US)

( * ) Notice: Subject to any disclaimer, the term of this patent is extended or adjusted under 35 U.S.C. 154(b) by 20 days.

(21) Appl. No.: 10/231,854

(22) Filed: Aug. 30, 2002

Related U.S. Application Data

(60) Provisional application No. 60/324,992, filed on Sep. 26, 2001, and provisional application No. 60/316,212, filed on Aug. 30, 2001.

(51) Int. Cl.$^7$ .......................... H05H 1/00; C23C 16/00
(52) U.S. Cl. ........................ 156/345.42; 156/345.46; 156/345.49; 118/723 MR; 118/723 MA
(58) Field of Search ................. 156/345.42, 345.46, 156/345.49; 118/723 MR, 723 MA; 315/111.41

(56) References Cited

U.S. PATENT DOCUMENTS

| | | | |
|---|---|---|---|
| 4,842,683 A | 6/1989 | Cheng et al. ............... 156/345 |
| 5,308,417 A | * 5/1994 | Groechel et al. ............. 216/67 |
| 5,444,207 A | * 8/1995 | Sekine et al. .......... 219/121.43 |
| 5,715,795 A | 2/1998 | Guentert et al. ............. 156/345 |
| 6,015,476 A | 1/2000 | Schlueter et al. ........... 156/345 |
| 6,416,639 B1 | * 7/2002 | De Bosscher et al. ... 204/298.2 |

* cited by examiner

Primary Examiner—Parviz Hassanzadeh
(74) Attorney, Agent, or Firm—Gordon E. Nelson

(57) ABSTRACT

Techniques used in systems that employ pairs of coils arranged around an axis to make a magnetic field that rotates around an axis to reduce or eliminate the effects of corners where adjacent ones of the coils meet on the uniformity of the magnetic field. The techniques are particularly useful in plasma reactors that employ magnetically-enhanced reactive ion etching technology. The techniques employ elements that are low cost and may be easily retrofitted to existing plasma reactors. The elements include magnetic shunts that are fitted to the corners of the coils to compensate for the corner effects, trim coils fitted to the corners that, when energized, compensate for the corner effects, and sets of coils that function as 180° coils and thereby reduce the corner effects. The magnetic shunts may be combined with the trim coils. This combination is particularly advantageous for dealing with the two levels of corner effects typically found in a plasma reactor; the magnetic shunt is sized to deal with the lower of the two levels and the shunt together with the energized trim coil deal with the higher of the two levels.

20 Claims, 8 Drawing Sheets

Prior Art    Fig. 1

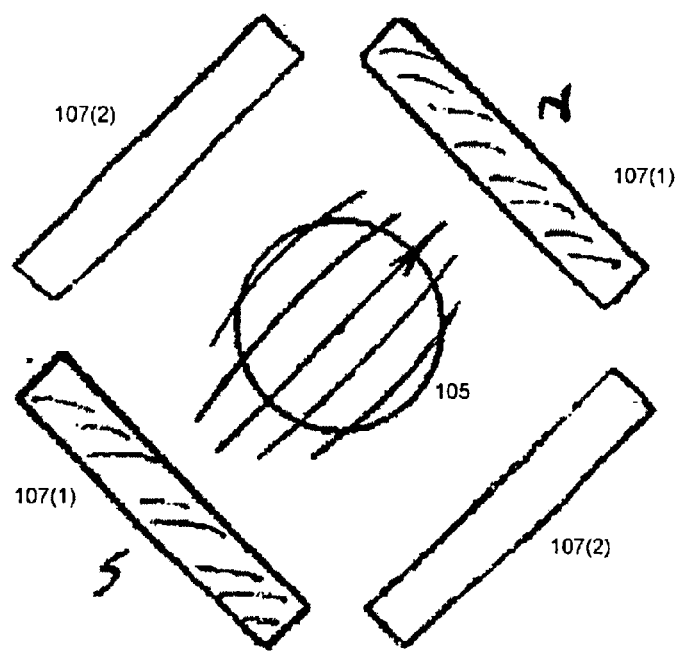
813
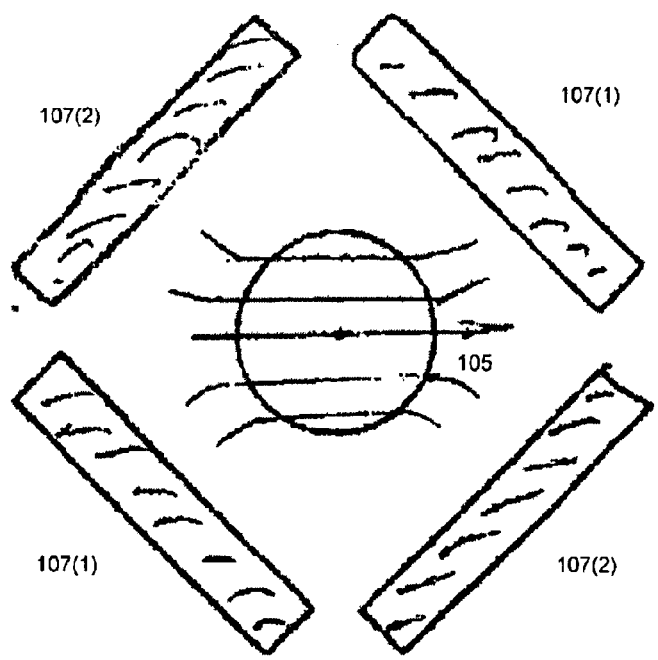
811
FIG. 2

TECHNIQUE FOR IMPROVING UNIFORMITY OF MAGNETIC FIELDS THAT ROTATE OR OSCILLATE ABOUT AN AXIS

CROSS REFERENCES TO RELATED APPLICATIONS

The present patent application claims priority from U.S. provisional patent application No. 60/316,212, Eugene L. Oster, Magnetic coil array with trim coils, filed Aug. 30, 2001, and from U.S. provisional patent application No. 60/324,992, Eugene L. Oster, Magnetic coil array for plasma etching, filed Sep. 26, 2001.

BACKGROUND OF THE INVENTION

1. Field of the Invention

The invention relates to the manipulation of magnetic fields and more particularly to making magnetic fields that rotate or oscillate about an axis. Such magnetic fields are employed in industrial processes that involve ionized atoms or molecules to achieve better distribution of the ionized atoms or molecules with regard to a workpiece, typically a wafer.

2. Description of Related Art: FIGS. 1, 2, and 8

Many industrial processes involve the application of ionized atoms or molecules to a substrate, either to implant the atoms or molecules in the substrate, to add a layer of atoms or molecules to the substrate, or to etch the substrate. In one large class of such processes termed reactive ion etching, or RIE, the process is done in a plasma reactor. The plasma reactor includes a vacuum chamber and a source of ions, typically a gas which is introduced into the vacuum chamber. The substrate is placed in the chamber, the chamber is evacuated, the gas is introduced, and radio frequencies are used to excite the gas to the point where it becomes a plasma.

A problem in the design and operation of plasma reactors is obtaining an even distribution of the ions with regard to the substrate. The distribution should be even not only with regard to numbers of ions, but also with regard to the energy of the ions. The need for even distribution is particularly pressing in the semiconductor industry, since failure to achieve an even distribution with regard to a semiconductor wafer may cause the devices on significant portions of the wafer to become non uniform or even useless.

One common technique for improving the distribution of ions with regard to the substrate is what is termed magnetic enhanced reactive ion etching, or MERIE. In MERIE, a moving magnetic field is used to increase the uniformity of the plasma and prevent plasma drift. FIG. 1 is a schematic of a typical plasma reactor 101 with MERIE as seen from above. Only those details of system 101 that are relevant to MERIE are shown here. The wall of the vacuum chamber is shown at 103; in a MERIE system, the wall is of non-magnetic materials. Within chamber 103 is substrate 105 to which the ions in the chamber are to be applied. Surrounding chamber 103 in an axial manner with regard to chamber 103 are two pairs of coils 107, pair 107(1), which are labeled N for north and S for south, and pair 107(2), which are labeled E for east and W for west. The arrows 116 on the coils show the direction of current flow in the top leg of the coil. In the vertical legs, current that is moving towards the observer is indicated by ".", current that is moving away from the observer is indicated by "x". When a coil is energized, it produces a magnetic field whose axis is perpendicular to the plane of the coil, as shown at 119 for N coil 107(1). When the coils 103 are energized, a magnetic field is produced that passes through chamber 103. The direction of the magnetic field, shown by arrow 117, is determined by the directions and strengths of the magnetic fields produced by the coils 107; thus, the magnetic field can be made to move by varying the amount of current being provided to each of the coils 107. Thus each coil 107 is energized by a separate power supply, PS 115 and the power supplies operate in a phase relationship with each other. The power supplies may be low-frequency AC power supplies, or they may be power supplies that switch the DC current. The minimum number of power supplies is one for each opposing pair of coils 107, but 1 per coil is preferred, since such an arrangement provides closer control of the magnetic field inside the vacuum chamber. While most MERIE reactors use four coils as shown in FIG. 1, the technique can of course be extended to systems with more pairs of coils. For a detailed discussion of MERIE, see the section Background Art in U.S. Pat. No. 6,015,476, Schlueter, et al., Plasma reactor magnet with independently controllable parallel axial current-carrying elements, issued Jan. 18, 2000. U.S. Pat. No. 6,015,476 is hereby incorporated by reference in its entirety and for all purposes into present patent application.

FIG. 8 shows typical current curves 801 for PS 115(1–4). The current curve 803 for coil N 107(1) is 90° out of phase with the current curve 807 for coil S 107(1), and the same is true for the current curve 805 for coil E 107(2) and the current curve 809 for coil W 107(2); moreover, current curves 805 and 809 are 45° out of phase with current curves 803 and 807. The uniformity of the magnetic field produced by coils 107 varies during operation. Uniformity is worst at points such as point 813, where one pair of the coils 107 is receiving maximum current and the other is receiving minimum current and best at points such as point 811, where both pairs of coils are receiving the same amount of current. In plasma reactors of the type shown in FIG. 1, the uniformity of the magnetic field varies by 50% during a complete rotation of the magnetic field. This is shown in FIG. 2. The diagram labeled 811 shows the magnetic field at point 811 in the current curves of FIG. 8, namely when both coil pairs 107(1 and 2) are receiving the same amount of current; the diagram labeled 813 shows the magnetic field at point 813 in the current curves of FIG. 8, namely when one coil pair is operating at maximum current and the other at minimum current. As is clear from FIG. 2, the magnetic field at point 811 in the current curves is far more uniform than the magnetic field at point 813. The less uniformity there is in the magnetic field, the less uniformity there will be in the plasma in the neighborhood of wafer 105; consequently, the lack of uniformity shown at 813 in FIG. 2 represents a major problem in MERIE systems.

An important cause of the lack of uniformity in the magnetic field produced by MERIE system 101 is the corners 113 where the coils 107 approach each other. In these corners, the currents flowing in the adjacent vertical legs of the coils that meet at the corner interact with the magnetic field produced generally by the coils and with the local magnetic fields produced by the currents in the vertical legs. The effects of current flow in the legs are particularly strong when the current is flowing in the same direction in the adjacent legs, as in corner 113(2). Of course, because the magnetic field is rotating, each corner in turn becomes a corner like 113(2). In the following, the effects on the uniformity of the magnetic field caused by corners 113 will be termed corner effects.

Solutions have been proposed for improving the uniformity of the magnetic field in MERIE systems, but these solutions involve a complete redesign of the reactor and can thus only be implemented in new plasma reactors. For examples of these solutions see the Schlueter patent referenced above and U.S. Pat. No. 5,718,795, Plavidal, et al., Radial magnetic field enhancement for plasma processing, issued Feb. 17, 1998. What is needed, and what is provided by the present invention is low-cost solutions which can be easily retrofitted to existing plasma reactors.

SUMMARY OF THE INVENTION

The solutions provided by the invention include a magnetic shunt which may be retrofitted to a corner to compensate for corner effects, a trim coil which may be retrofitted and energized to compensate for the corner effects, a retrofittable combination of the shunt and the trim coil, and retrofittable coils which function as 180° coils. The magnetic shunt, the trim coil, and the combination may all be employed to compensate for the remaining corner effects in systems using the retrofittable 180° coils. A particularly advantageous combination of the trim coil and the magnetic shunt is used to deal with the fact that there are generally two levels of corner effects that must be compensated for. In this combination, the magnetic shunt is sized so that it compensates for the first level of corner effects and the energized trim coil and the magnetic shunt together compensate for the second level of corner effects. A further advantage of this arrangement is that the energized trim coil causes the magnetic shunt to saturate.

Other objects and advantages will be apparent to those skilled in the arts to which the invention pertains upon perusal of the following Detailed Description and drawing, wherein:

BRIEF DESCRIPTION OF THE DRAWING

FIG. 2 shows magnetic fields produced in the prior-art MERIE plasma reactor;

Figure 1:
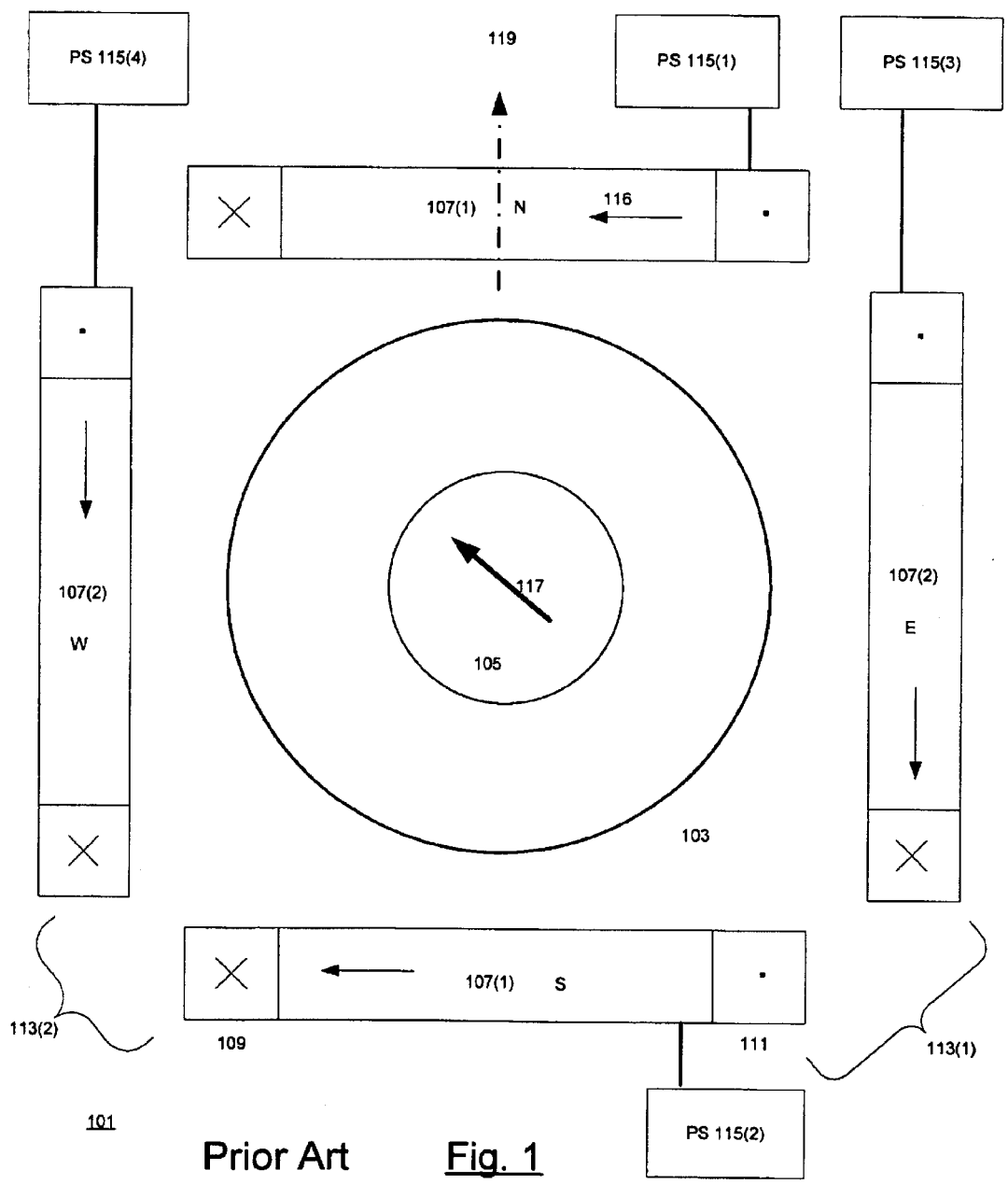
FIG. 1 is a schematic top view of a prior-art MERIE plasma reactor.

Reference numbers in the drawing have three or more digits: the two right-hand digits are reference numbers in the drawing indicated by the remaining digits. Thus, an item with the reference number 203 first appears as item 203 in FIG. 2.

DETAILED DESCRIPTION

As mentioned in the Description of related art, one of the major contributors to nonuniformity of magnetic fields in MERIE plasma reactors of the kind shown in FIG. 1 is corner effects. In the following, a number of techniques will be presented for reducing corner effects by adding elements to the MERIE plasma reactors. The added elements can be easily retrofitted to existing MERIE plasma reactors.

Figure 3:
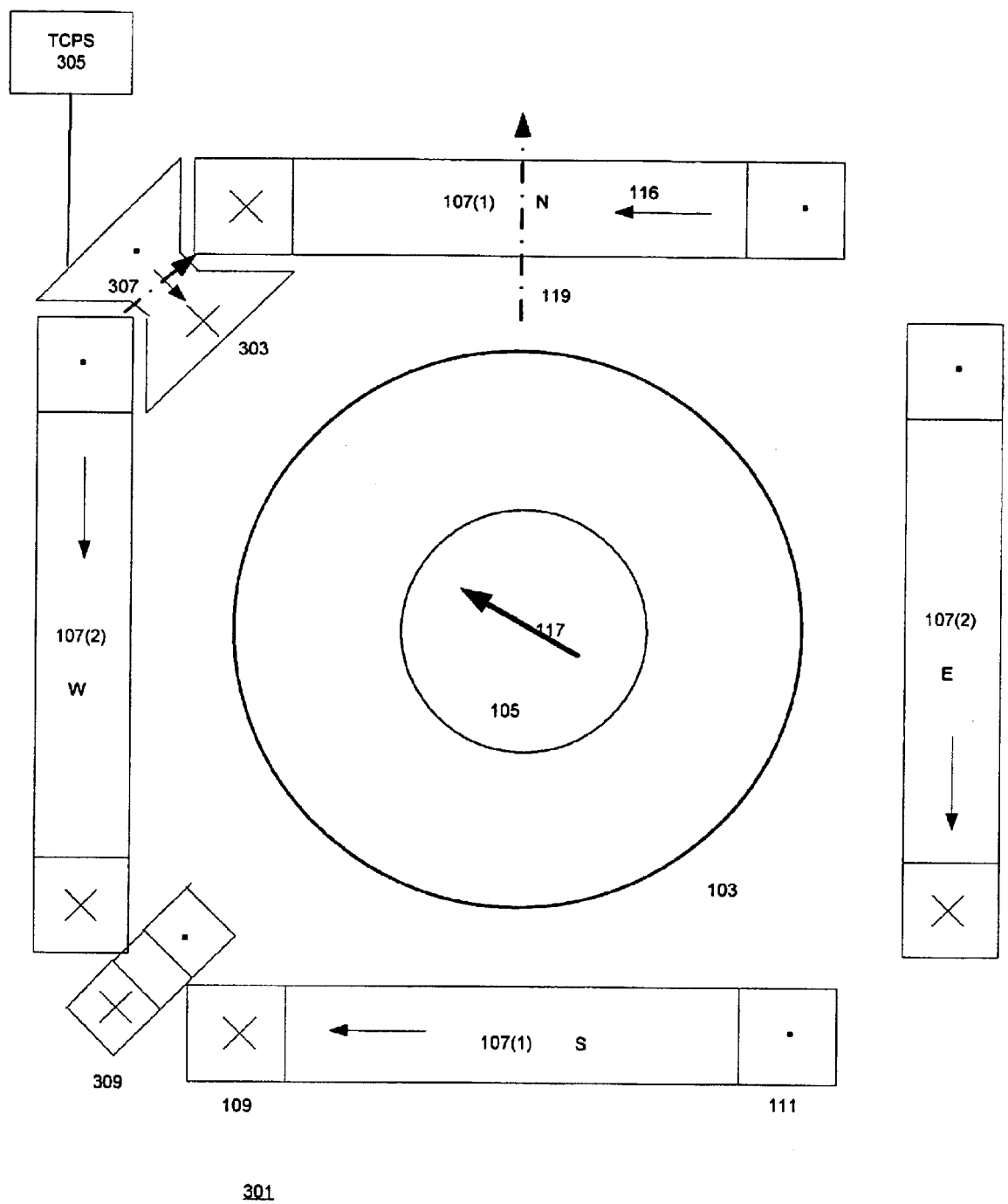
FIG. 3 shows a version of a MERIE plasma reactor to which trim coils have been added.

Adding Trim Coils to the Corners: FIG. 3

FIG. 3 shows a MERIE system 301 in which trim coils 303 have been added to the corners where the coils 107 meet to counteract the corner effects. The trim coils 303 have vertical legs as long as or slightly longer than the vertical legs of the coils 107; the size of the horizontal legs is determined by the corner to be filled. When the trim coil is in operation, the axis 307 of its magnetic field is in the same plane as and at an angle of 45° to the axes of the magnetic fields of the coils that form the corner where the trim coil is installed. Each trim coil 303 has its own independent trim coil power supply 305, and power supply 305 is used to energize trim coil 303 as required to counteract the corner effects in the corner where it is installed. For example, when current in both vertical legs of the coils 107 in the corner where the trim coil is installed is flowing in the same direction, the power supply would energize the trim coil so that the current flowed in the opposite direction to that in the vertical legs. The space where the trim coils are installed is generally unused, and thus they can be easily retrofitted. Trim coil 303 as shown is designed to fit exactly into the corner where it is installed; experience has, however, shown that a simple coil like that shown at 309 works nearly as well. In a system in which the magnetic field rotates, trim coils are installed in each of the corners; in systems in which the magnetic field does not rotate, they may be installed only where required to deal with particularly strong corner effects.

Figure 4:
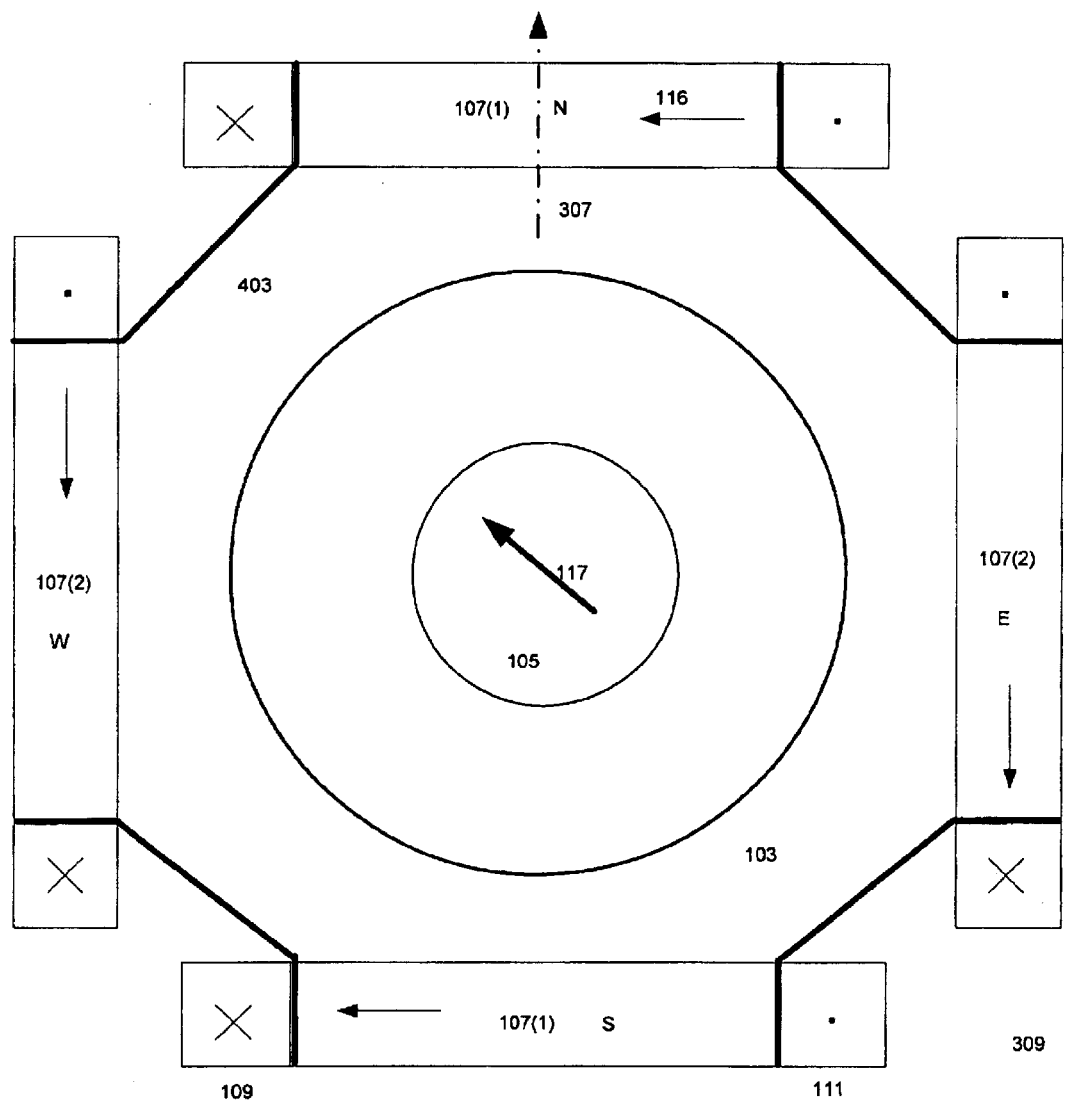
FIG. 4 shows a version of a MERIE plasma reactor to which magnetic shunts have been added.

Adding Magnetic Shunts to the Corners: FIG. 4

FIG. 4 shows a MERIE system 401 in which shunts 403 made of magnetic materials have been added to the corners where coils 107 meet to counteract the corner effects. Again, the space where the shunts are placed is generally unused in MERIE systems and the shunts can be easily retrofitted. The shunts shown in FIG. 4 are simply flat plates; the shunts need not be flat and may, for example, be shaped to accommodate a vacuum chamber that has square corners. The vertical edges of the shunts should overlap the vertical legs of the coil, as shown in FIG. 4. The effect of the shunt on the corner effect may be increased or decreased by increasing or decreasing the length of the shunt relative to the length of the vertical legs of coils 107.

Figure 5:
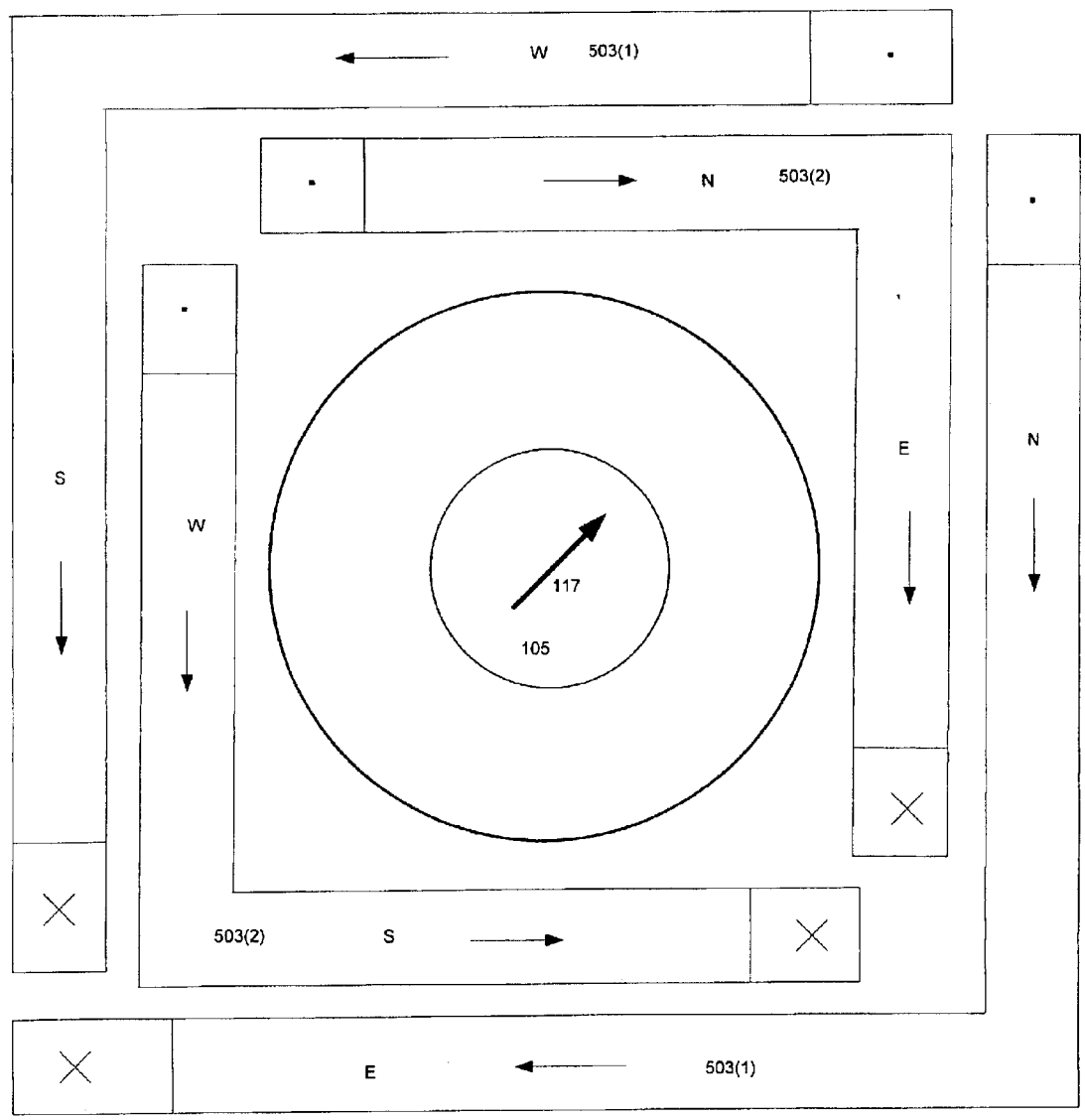
FIG. 5 shows a version of a MERIE plasma reactor which employs pairs of 180° coils.
Figure 6:
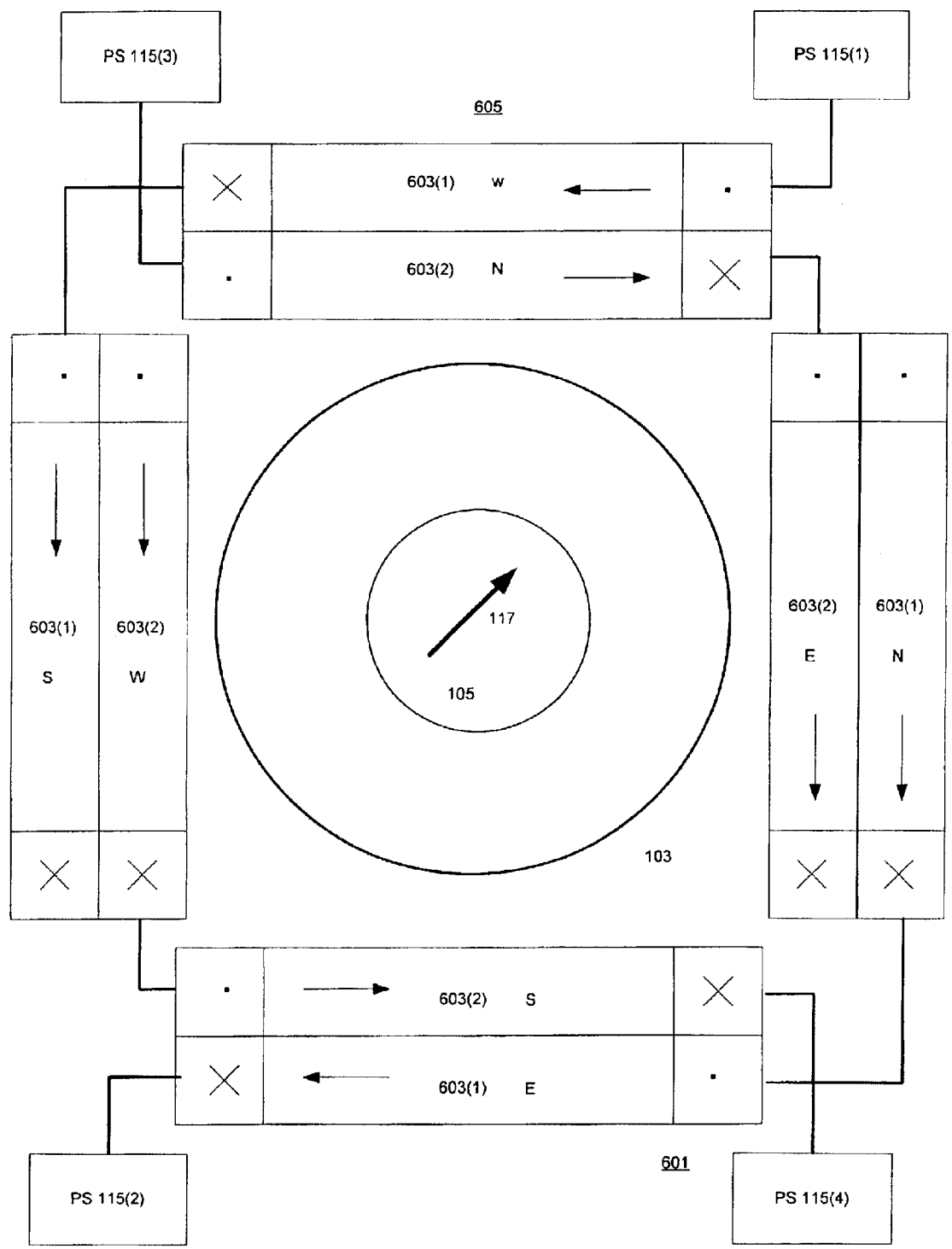
FIG. 6 shows a version of a MERIE plasma reactor which simulates pairs of 180° coils with eight 90° coils.

Using 180° Coils: FIGS. 5 and 6

Another way of mitigating the corner effects is to reduce the number of corners. One technique for doing this is shown in FIG. 5, in which the 90° coils 170 of FIG. 1 (so called because each coil covers 90° of the circle through which the magnetic field rotates) are replace by 180° coils 503. A pair of 180° coils has only two corners where there can be corner effects, instead of the four of system 101. In order to make the magnetic field move, two pairs of coils 503 are used, pair 503(1) and pair 503(2). Pair 503(1) is rotated 90° with regard to pair 503(2). Each coil 503 has its own power supply as shown in FIG. 1 and the power supplies operate in a phased relationship as described in the discussion of FIG. 1. Again, these coils can simply replace the coils 107 of an existing system like that shown in FIG. 1.

A problem with coils 503 is that the angled 180° coils are relatively expensive to manufacture compared with the flat 90° coils. However, a 180° coil may be simulated by a pair of 90° coils that are connected in series, and thus a MERIE system that produces almost as uniform a magnetic field as system 501 may be produced as shown in FIG. 6. FIG. 6 replaces each coil 503 with a pair of adjacent coils 603. A pair of adjacent coils 603 and a pair of adjacent coils 603 opposite to that pair make up a pair of coils 503; thus, in FIG. 6, the four coils labeled 603(2) correspond to the pair of coils labeled 503(2). All of the coils 603 corresponding to a given coil 503 are connected in series to the same power supply. Four power supplies 115 are shown in FIG. 6, one, 115(1), connected to coils 603(1) W and S, one, 115(2) connected to coils 603(1) N and E, and so on. The power supplies cause the magnetic field to move by energizing the sets of coils in a phased relationship as described with regard to system 101. To ease retrofitting, each of the four double coils 605 surrounding vacuum chamber 103 in system 601 could be made with the same dimensions as a single coil 107 in system 101.

Figure 7:
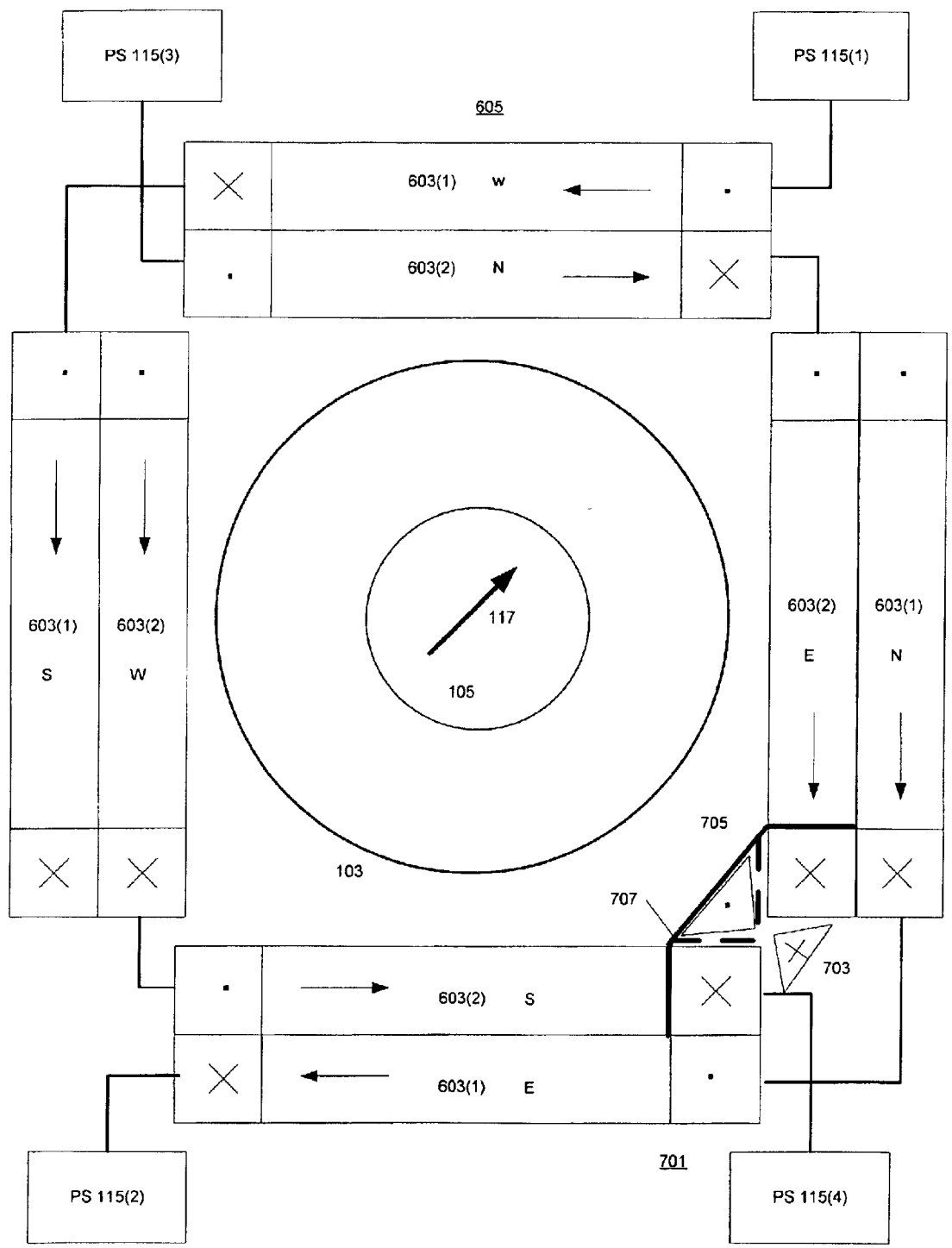
FIG. 7 shows ways in which the shunts and trim coils may be used in the MERIE plasma reactor of FIG. 6.
Figure 8:
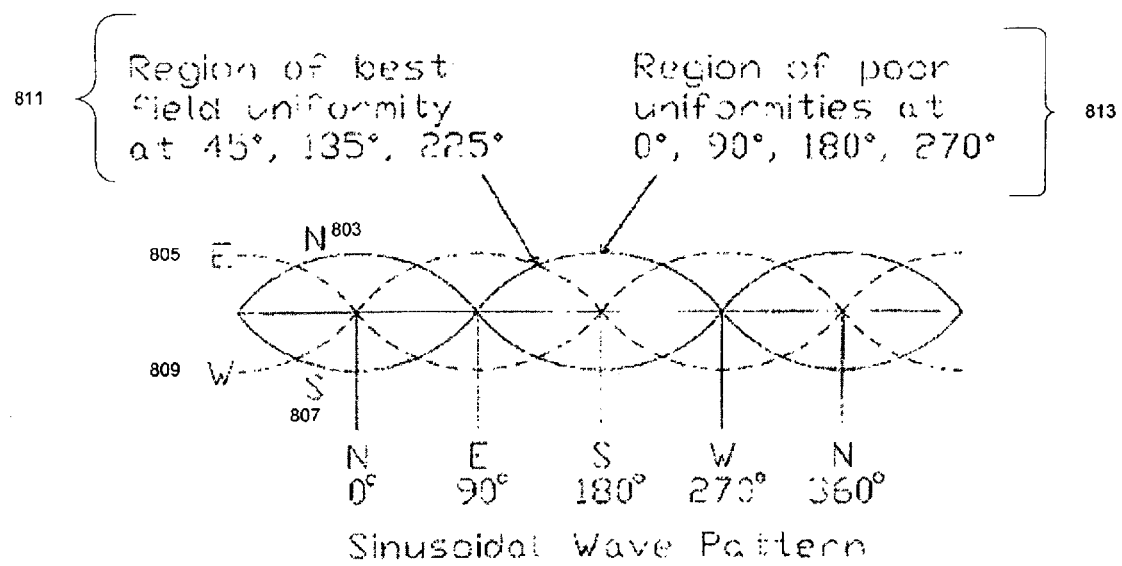
FIG. 8 shows current curves for the power supplies of FIG. 1.

Combining the Techniques: FIG. 7

Trim coils, shunts, and actual or simulated 180° coils may of course be combined to reduce corner effects. Shunts may be combined with trim coils, and shunts and trim coils may be used either separately or together to reduce corner effects in the corners of MERIE systems using 180° coils. FIG. 7 shows a MERIE system 701 in which a trim coil 703 is used together with a shunt 705 to reduce corner effects. Only the trim coil-shunt combination in the lower right-hand corner of system 701 is shown; of course the same arrangement would be used in the other corners. The arrangement shown in system 701 overcomes a problem of using shunts alone to deal with corner effects: that a shunt which compensates successfully for a corner when the current in both vertical legs belonging to the corner is flowing in the same direction overcompensates for a corner when that is not the case. The problem is solved by making the shunt the correct length to compensate for corner effects when the current in both legs is not flowing in the same direction and then using the trim coil to provide extra compensation when the current in the vertical legs is flowing in the same direction. A further advantage of using the trim coil in this fashion is that it can saturate the shunt, which eliminates any further interaction between the shunt and the magnetic field. The shunt can also take the form and position shown in dashed lines at 707.

Conclusion

The foregoing Detailed Description has disclosed to those skilled in the relevant arts how to employ the techniques for reducing and/or compensating for corner effects in rotating magnetic fields that are the subject matter of this patent application and has further disclosed the best mode presently known to the inventor for employing his techniques. As will be immediately apparent to those skilled in the relevant arts, there are many ways of implementing the techniques disclosed herein. For example, the shunts may be made of any magnetic material, may have any shape that serves the purpose, and may be installed in any manner that connects the shunt to the coils. In general, the particular material, size, shape, and mode of installation of a shunt will depend on characteristics of the system to which the shunt is being retrofitted. The same is true with trim coils, with combinations of shunts and trim coils, and with replacement coils that function as 180° coils. Since there are so many ways of implementing Applicant's techniques, the Detailed Description is to be regarded as being in all respects exemplary and not restrictive, and the breadth of the invention disclosed herein is to be determined not from the Detailed Description, but rather from the claims as interpreted with the full breadth permitted by the patent laws.

What is claimed is:

1. Apparatus for producing a moving magnetic field that moves with a rotational motion around an axis, the apparatus comprising:

a plurality of pairs of energizable magnetic elements arranged around the axis, each member of a pair being opposite the other member relative to the axis and the elements being energized according to a sequence such that the magnetic field moves with the rotational motion; and one or more compensating elements that are mechanically fitted to the pairs of energizable magnetic elements and compensate for a distortion in the magnetic field caused by an interaction between adjacent ones of the energizable magnetic elements during the sequence of energization.

2. The apparatus for producing a moving magnetic field set forth in claim 1 wherein:

the compensating element is a magnetic shunt placed where one of the energizable magnetic elements approaches another one of the energizable magnetic elements.

3. The apparatus for producing a moving magnetic field set forth in claim 1 wherein:

the compensating element is an additional energizable magnetic element that is placed where one of the energizable magnetic elements approaches another one of the energizable magnetic elements and is energized in a manner that reduces the distortion.

4. The apparatus for producing a moving magnetic field set forth in claim 1 wherein:

the compensating element is a combination of an additional energizable magnetic element and a magnetic shunt, the combination being placed where one of the energizable magnetic elements approaches another one of the energizable magnetic elements and the additional magnetic element being energized in a manner such that the combination of the magnetic shunt and the additional magnetic element compensates for the distortion.

5. The apparatus for producing a moving magnetic field set forth in claim 4 wherein:

there are two levels of distortion caused by the interaction; and the magnetic shunt compensates for the first level and the magnetic shunt together with the energized additional magnetic element compensates for the second level of distortion.

6. The apparatus for producing a moving magnetic field set forth in claim 5 wherein:

the energized additional magnetic element further saturates the magnetic shunt.

7. The apparatus for producing a moving magnetic field set forth in claim 1 wherein:

the apparatus is a component of a plasma reactor wherein the moving magnetic field is used to make the plasma more uniform.

8. The apparatus for producing a movable magnetic field set forth in claim 1 wherein:

the compensating elements are retrofitted to preexisting pairs of the energizable magnetic elements.

9. Apparatus for compensating for corner effects in a rotationally-moving magnetic field generated by a plurality of pairs of opposing coils in a plasma reactor, the apparatus comprising:

a magnetic shunt which is adapted to be retrofitted to a corner formed by coils belonging to the plurality of opposing coils.

10. The apparatus for compensating for corner effects set forth in claim 9 further comprising:

a trim coil which is adapted to be retrofitted to the corner together with the magnetic shunt, the trim coil being energized as required to compensate for the corner effect.

11. The apparatus for compensating for corner effects set forth in claim 10 wherein:

each corner may have a first level of corner effect and a second level of corner effect; and the magnetic shunt compensates for the first level of corner effect and the combination of the magnetic shunt and the energized trim coil compensates for the second level of corner effect.

12. The apparatus for compensating for corner effects set forth in claim 11 wherein:

the energized trim coil further saturates the magnetic shunt.

13. Apparatus for compensating for corner effects in a rotationally-moving magnetic field generated by a plurality of pairs of opposing coils in a plasma reactor, the apparatus comprising:

a trim coil which is adapted to be retrofitted to the corner, the trim coil being energized as required to compensate for the corner effect.

14. Apparatus for reducing corner effects in a rotationally-moving magnetic field generated by a plurality of pairs of opposing coils in a plasma reactor, the apparatus comprising:

a set of coils which function as 180° coils and which are adapted to replace the pairs of opposing coils.

15. The apparatus for reducing corner effects set forth in claim 14 further comprising:

a compensating element in a corner between adjacent ones of the 180° coils that compensates for the corner effects.

16. The apparatus for reducing corner effects set forth in claim 15 wherein:

the compensating element is a magnetic shunt.

17. The apparatus for reducing corner effects set forth in claim 16 wherein:

the compensating element further comprises:

a trim coil which is energized as required to compensate for the corner effect.

18. The apparatus for reducing corner effects set forth in claim 17 wherein:

the corner has a first level of corner effect and a second level of corner effect; and the magnetic shunt compensates for the first level of corner effect and the combination of the magnetic shunt and the energized trim coil compensates for the second level of corner effect.

19. The apparatus for reducing corner effects set forth in claim 18 wherein:

the energized trim coil further saturates the magnetic shunt.

20. The apparatus for reducing corner effects set forth in claim 15 wherein:

the compensating element is a trim coil which is energized as required to compensate for the corner effect.

* * * * *